(12) United States Patent
Flower (10) Patent No.: US 7,129,640 B2
(45) Date of Patent: Oct. 31, 2006

(54) INTEGRATED CIRCUIT DEVICE FOR DRIVING A LASER DIODE WITH REDUCED HEAT TRANSFER AND METHOD FOR FABRICATING THE DEVICE

(75) Inventor: Graham McRae Flower, San Jose, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 150 days.

(21) Appl. No.: 10/454,172

(22) Filed: Jun. 3, 2003

(65) Prior Publication Data

US 2004/0245936 A1 Dec. 9, 2004

(51) Int. Cl.
*H05B 37/00* (2006.01)
*H01L 21/44* (2006.01)

(52) U.S. Cl. .................. 315/120; 438/122; 257/712; 257/717

(58) Field of Classification Search ................ 136/204, 136/201, 205, 203, 200, 225; 62/3.3, 3.2; 315/169.3, 169.1, 312–313, 120; 438/122; 361/719, 735, 784; 257/724, 712–717, 675, 257/720, 796, 787
See application file for complete search history.

(56) References Cited

U.S. PATENT DOCUMENTS

| | | | |
|---|---|---|---|
| 3,479,570 A | 11/1969 | Gilbert | |
| 4,908,736 A | 3/1990 | Webster | |
| 5,164,884 A * | 11/1992 | Pesola | 361/717 |
| 5,543,663 A | 8/1996 | Takubo | |
| 5,898,571 A * | 4/1999 | Mertol | 361/704 |
| 5,923,084 A * | 7/1999 | Inoue et al. | 257/712 |
| 5,977,626 A * | 11/1999 | Wang et al. | 257/707 |
| 6,250,085 B1 * | 6/2001 | Tousson | 62/3.7 |
| 6,252,776 B1 | 6/2001 | Saito et al. | |
| 6,297,960 B1 * | 10/2001 | Moden et al. | 361/719 |
| 6,300,208 B1 * | 10/2001 | Talwar et al. | 438/308 |
| 6,596,565 B1 * | 7/2003 | Hembree | 438/122 |
| 6,630,371 B1 * | 10/2003 | Hembree | 438/118 |
| 6,686,532 B1 * | 2/2004 | Macris | 136/204 |
| 6,727,422 B1 * | 4/2004 | Macris | 136/201 |
| 6,743,972 B1 * | 6/2004 | Macris | 136/201 |
| 2004/0126931 A1* | 7/2004 | Hembree | 438/122 |

FOREIGN PATENT DOCUMENTS

EP 0727928 8/1996

* cited by examiner

*Primary Examiner*—Tho Phan
*Assistant Examiner*—Chuc Tran (57) ABSTRACT

An integrated circuit (IC) device for driving a light emitting device, such as a laser diode, includes a heat-absorbing structure fabricated on a substrate over an electrical component, such as an output transistor, to reduce the heat transfer between the electrical component and the light emitting device. The heat-absorbing structure is designed to absorb some of the heat generated by the electrical component so that less heat from the electrical component is transferred to the light emitting device, which reduces the operating temperature of the light emitting device. A method of fabricating the IC device includes forming the electrical component on the substrate and forming the heat-absorbing structure on the substrate over the electrical component. The heat-absorbing structure may be configured to substantially encase the electrical component.

21 Claims, 12 Drawing Sheets

INTEGRATED CIRCUIT DEVICE FOR DRIVING A LASER DIODE WITH REDUCED HEAT TRANSFER AND METHOD FOR FABRICATING THE DEVICE

FIELD OF THE INVENTION

The invention relates generally to integrated circuit devices, and more particularly to an integrated circuit device for driving a laser diode.

BACKGROUND OF THE INVENTION

Laser diodes are widely used in optical communications systems to transmit optical signals because of their desirable characteristics, such as high output power, narrow spectral width and fast switching speed. Unfortunately, laser diodes are intolerant of high temperatures. Currently, the performance of a laser diode typically degrades sharply as the operating temperature rises to around 80 degree Celsius. Thus, the operating temperature of a laser diode should be maintained at a temperature below 80 degrees Celsius to ensure that the laser diode performs at a desirable level.

One conventional technique to maintain the operating temperature of a laser diode below a prescribed temperature, e.g., 80 degrees Celsius, is to thermally connect a cooling device, such as a heat sink or a thermoelectric cooler, to the laser diode. The cooling device operates to dissipate the heat from the laser diode to reduce the operating temperature of the laser diode such that the laser diode can be maintained below the prescribed temperature. However, the operating temperature of a laser diodes is not only dependent on the heat generated by the laser diode itself but also on the heat generated by electrical components in close proximity to the laser diode. In particular, the heat generated by an output transistor of an integrated circuit (IC) device for driving the laser diode contributes a significant amount of heat to the laser diode, increasing the operating temperature of the laser diode. Due to the heat contribution of the output transistor of the IC device to the operating temperature of the laser diode, the cooling device may not be able to maintain the operating temperature of the laser diode below the prescribed temperature. Alternatively, the required size of the cooling device to maintain the operating temperature of the laser diode below the prescribed temperature may exceed a practical limit when the heat contribution from the output transistors is taken into consideration. Therefore, reducing the heat contribution of the output transistor of the IC device to the operating temperature of the laser diode is desirable.

One solution to reduce the heat contribution of the output transistor of the IC device to the operating temperature of the laser diode is to increase the distance between the output transistor and the laser diode. However, due to inductive effect, the output transistor must be placed very close to the laser diode for high speed applications. In addition, there is an increasing demand to reduce the size of the overall product and increase port density. Thus, increasing the distance between the output transistor and the laser diode is not, in general, a practical solution.

Another solution is to decrease the power dissipation of the output transistor to correspondingly decrease the heat generated by the output transistor. However, a laser diode typically require high driving currents, and consequently, the high driving currents must be passed through the output transistor of the IC device to drive the coupled laser diode.

In view of these constraints, what is needed is an IC device for driving a laser diode that reduces the amount of heat transferred from an output transistor of the IC device to the laser diode without reducing the driving currents supplied to the laser diode.

SUMMARY OF THE INVENTION

An integrated circuit (IC) device for driving a light emitting device, such as a laser diode, includes a heat-absorbing structure fabricated on a substrate over an electrical component to reduce the heat transfer between the electrical component and the light emitting device. The heat-absorbing structure is designed to absorb some of the heat generated by the electrical component so that less heat from the electrical component is transferred to the light emitting device, which reduces the operating temperature of the light emitting device. The use of the heat-absorbing structure allows the light emitting device to be maintained at a lower temperature without reducing driving currents supplied to the light emitting device by the IC device.

In accordance with the invention, the heat-absorbing structure of the IC device may be formed of multi-level patterned metal layers, which encase the electrical component. As an example, the metal layers that form the heat-absorbing structure may be made of aluminum and/or titanium. The IC device may further include one or more heat-insulating trenches located between the electrical component and the light emitting device. The heat-insulating trenches functions as thermal barriers between the electrical component and the light emitting device.

A method for fabricating the IC device in accordance with the invention includes providing a substrate, which may be a silicon substrate, forming an electrical component on the substrate, and forming a thermally conductive structure on the substrate over the electrical component. The thermally conductive structure may be formed by sequentially depositing and patterning appropriate metallic materials. The method may also include forming one or more heat-insulating trenches in the substrate between the electrical component and the light emitting device.

Other aspects of the present invention will become apparent from the following detailed description, taken in conjunction with the accompanying drawings, illustrated by way of example of the principles of the invention.

DETAILED DESCRIPTION

Figure 1:
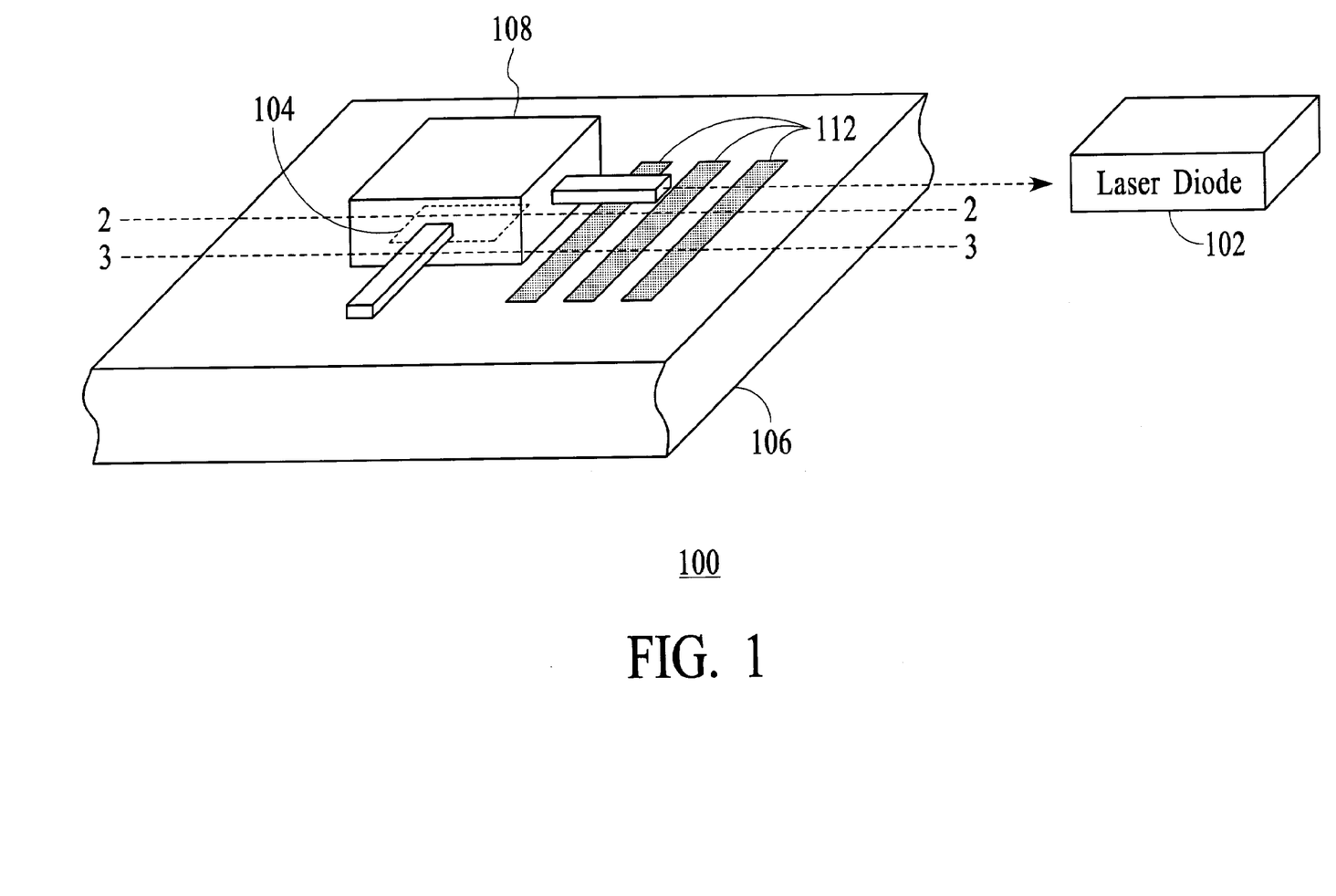
FIG. 1 is a diagram of an integrated circuit (IC) device in accordance with one embodiment of the present invention.

With reference to FIG. 1, a diagram of an integrated circuit (IC) device 100 for driving a laser diode 102, or any other device, in accordance with one embodiment of the invention is shown. The IC device 100 includes at least one electrical component 104, which generates heat during operation. The electrical component 104 is configured to supply driving currents to the laser diode 102 to selectively activate the laser diode for optical signal generation. The IC device 100 is designed to reduce heat transfer between the electrical component 104 and the laser diode 102 to decrease the amount of heat generated by the electrical component that contributes to the operating temperature of the laser diode. Thus, with the use of the IC device 100, the laser diode 102 can be maintained at a lower operation temperature to ensure proper performance of the laser diode without decreasing the driving currents or increasing the distance between the IC device and the laser diode.

As shown in FIG. 1, the IC device 100 includes a substrate 106, such as a silicon substrate, on which the electrical component 104 is fabricated. As illustrated and described herein, the electrical component 104 is an output bipolar transistor of a driver circuit (not shown) fabricated on the substrate 106. However, the electrical component 104 can be any type of transistor fabricated on the substrate 106. Alternatively, the electrical component 104 can be any electrical element fabricated on the substrate 106 that generates excessive heat during operation, which can increase the operating temperature of the laser diode 102.

The IC device 100 further includes a heat-absorbing structure 108 formed on the substrate 106 over the output transistor 104. The heat-absorbing structure 108 is made of a thermally conductive material to absorb some of the heat generated by the output transistor 104. As an example, the heat-absorbing structure 108 may be composed of a metallic material that is highly conductive with respect to thermal energy. Due to the heat-absorbing structure 108, less heat from the output transistor 104 is transferred to the laser diode 102, which allows the laser diode 104 to operate at a lower temperature. As illustrated in FIG. 1, the heat-absorbing structure 108 can be shaped like a rectangular box without a bottom. Thus, the output transistor 104 is encased or encapsulated by the heat-absorbing structure 108, which is positioned over the output transistor. In other embodiments, the heat-absorbing structure 108 may be configured in other encasing geometrical shapes, such as a hexagonal box. Furthermore, in other embodiments, one or more sides of the heat-absorbing structure 108 may be open, including the top surface of the structure. In addition, one or more sides of the heat-absorbing structure 108 may not be solid, including the top surface of the structure. As described in more detail below, the sides of the heat-absorbing structure 108 may be formed of multi-leveled metal layers, which are interconnected by plugs. Thus, the sides of the heat-absorbing structure 108 may include openings, which are created by spaces between the interconnecting plugs. Since the heat-absorbing structure 108 may have one or more open sides, one or more sides with openings and/or a top surface that is either open or includes openings, the heat-absorbing structure may substantially encase the output transistor 104, rather than entirely encasing the output transistor.

The IC device 100 also includes heat-insulating trenches 112. Although three heat-insulating trenches 112 are shown in FIG. 1, the IC device 100 may include any number of heat-insulating trenches 112. The heat-insulating trenches 112 are trenches filled with a thermally insulating material to reduce the transfer of heat from the output transistor 104 toward the laser diode 102. Thus, the heat-insulating trenches 112 function as thermal barriers between the output transistor 104 and the laser diode 102. Although any thermally insulating material can be used to fill the heat-insulating trenches 112, the heat-insulating trenches are preferably filled with oxide, which has a good thermally insulating property. In addition, oxide-filled trenches are commonly used as trench isolations for transistors, such as the output transistor 104. Therefore, the heat-insulating trenches 112 filled with oxide can be fabricated using well-established fabrication processes. The number of heating-insulating trenches 112 included in the IC device 100 can be varied as needed.

Figure 2:
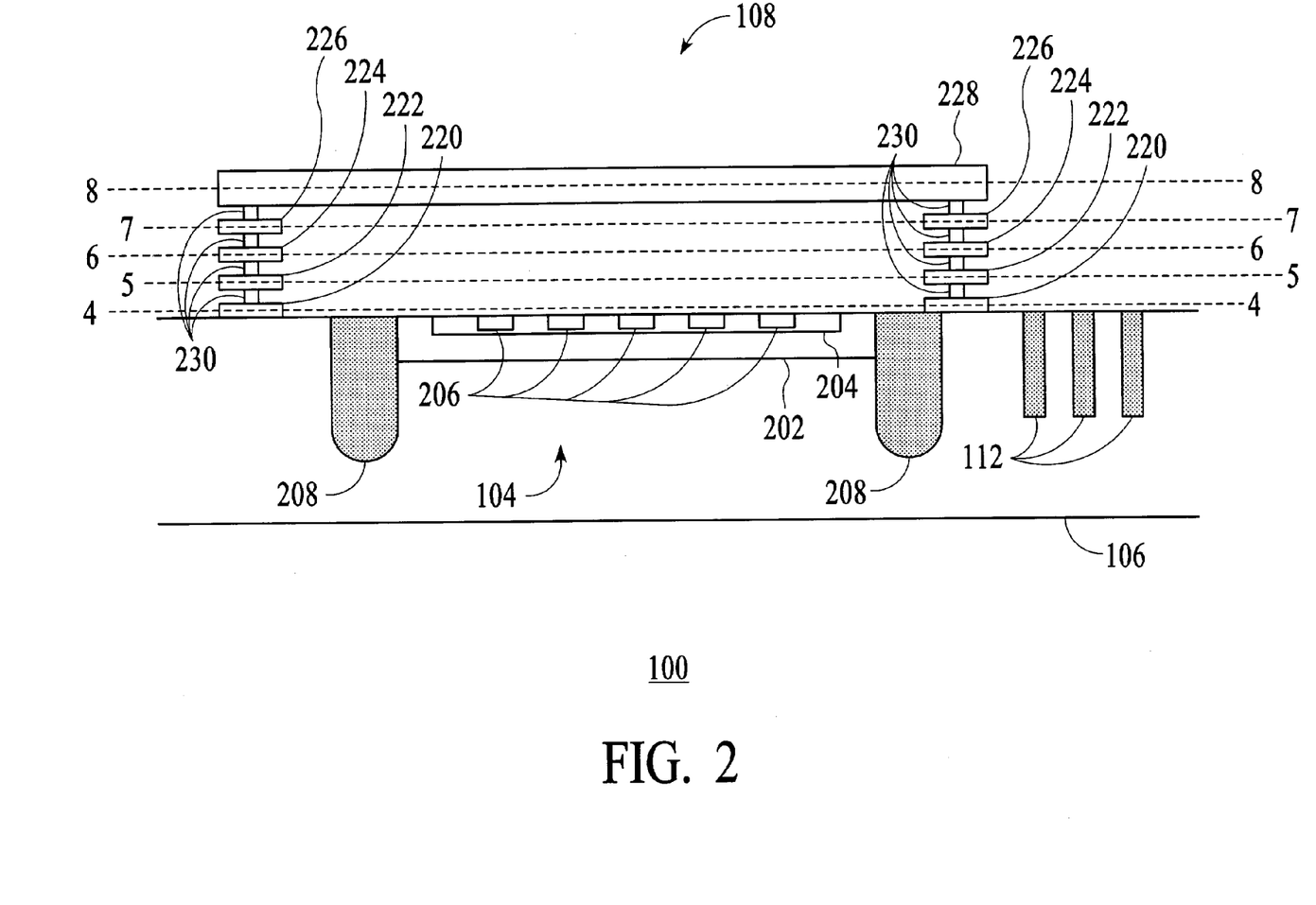
FIGS. 2 and 3 are different cross-sectional side views of the IC device of FIG. 1.
Figure 3:
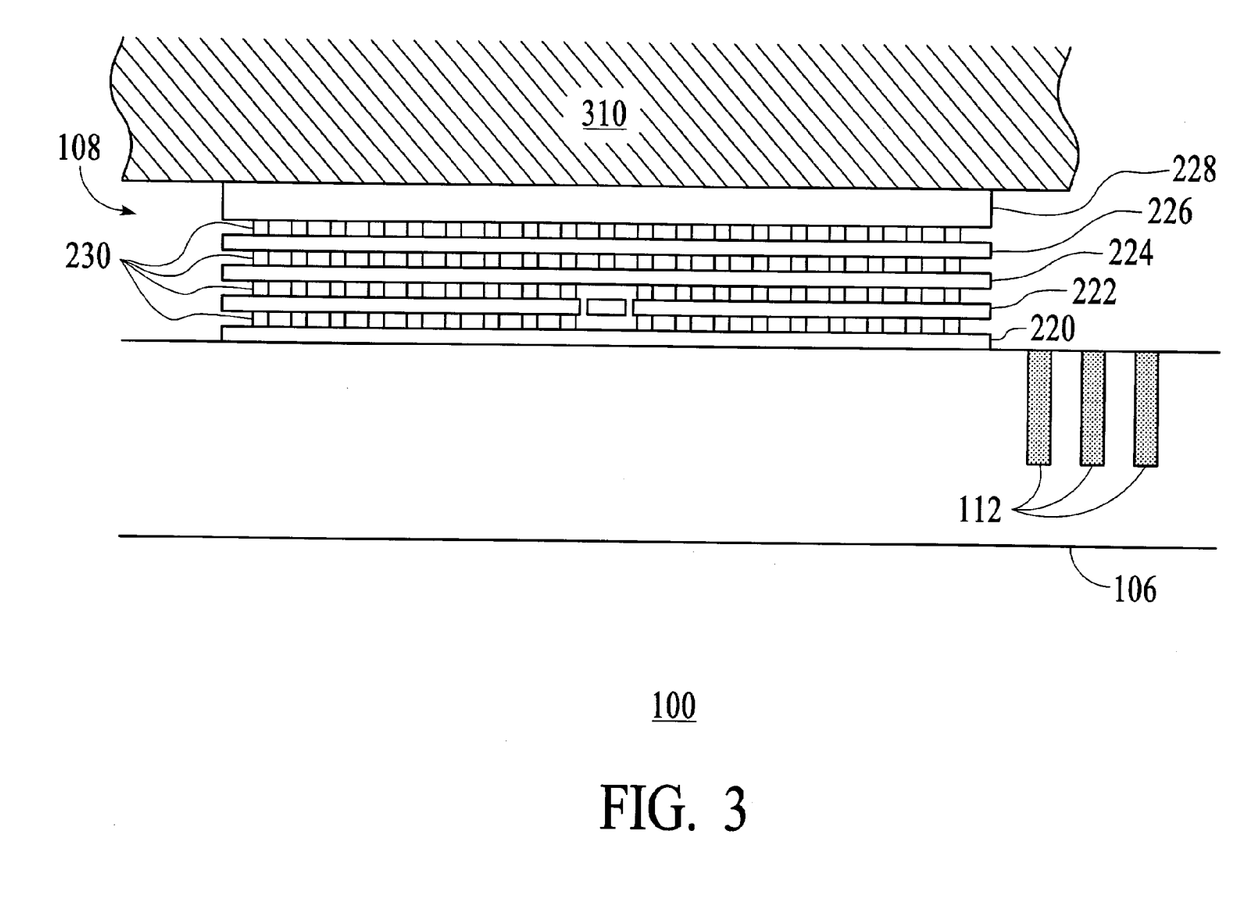
Figure 4:
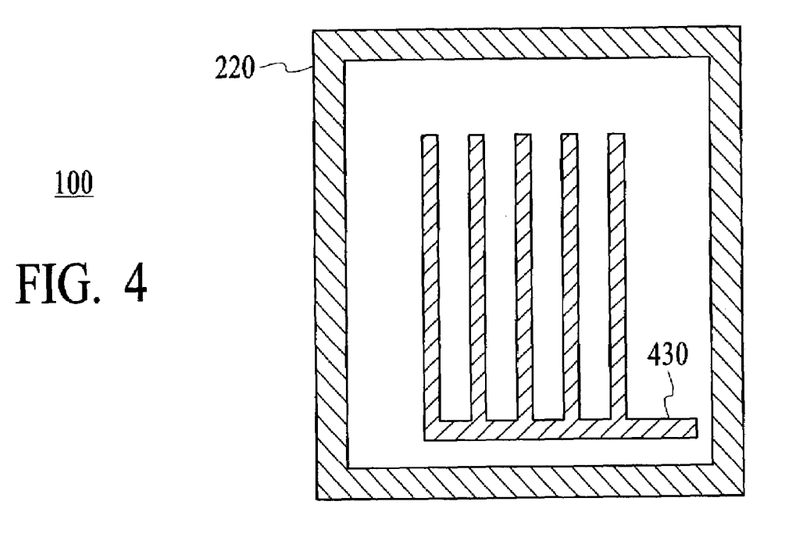
FIGS. 4–8 are different cross-sectional top views of the IC device of FIG. 1.
Figure 5:
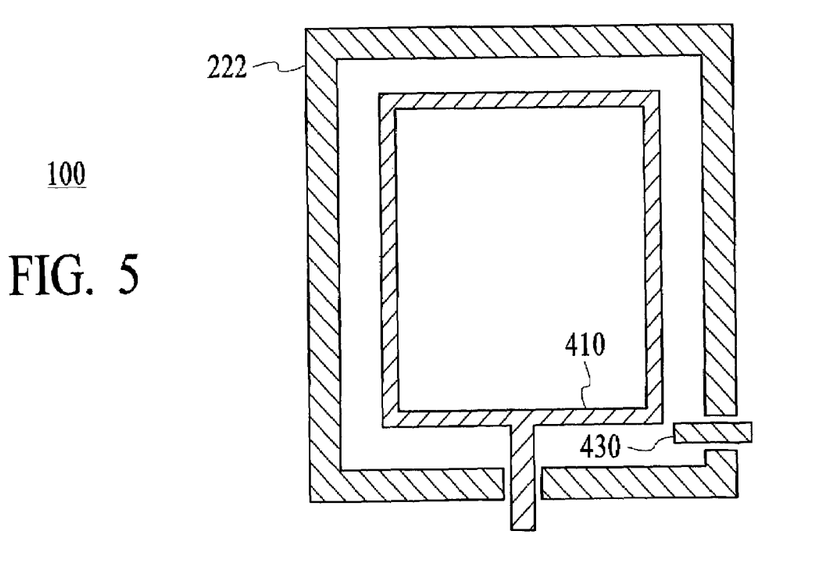
Figure 6:
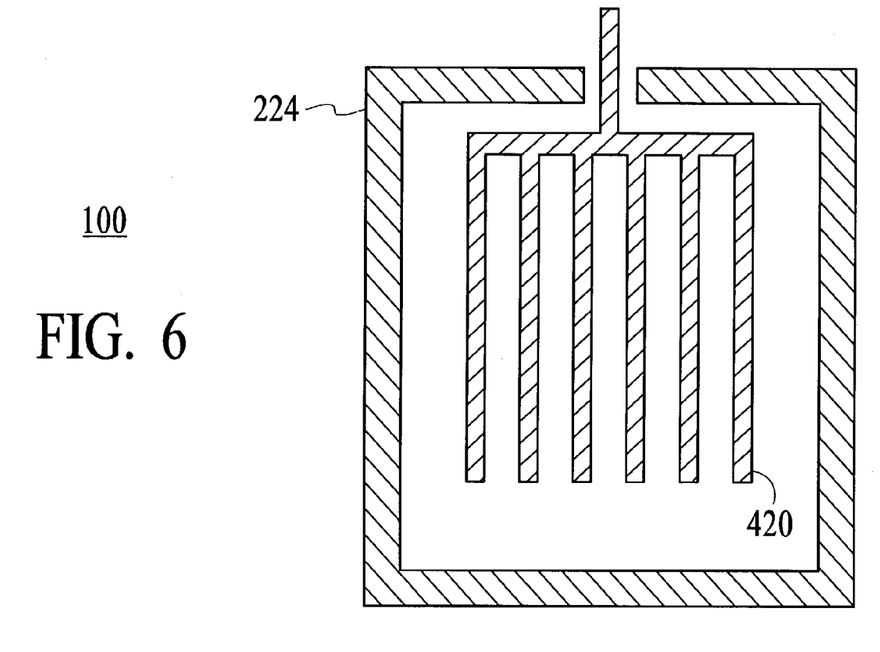

The output transistor 104, the heat-absorbing structure 108 and the heat-insulating trenches 112 of the IC device 100 are now described in more detail with reference to FIGS. 2–8. FIGS. 2 and 3 are cross-sectional side views of the IC device 100 along lines 2—2 and 3—3, respectively, which are shown in FIG. 1. The line 2—2 dissects the heat-absorbing structure 108 along the center of the structure. The line 3—3 dissects the heat-absorbing structure 108 along one sidewall of the structure. FIGS. 4–8 are cross-sectional top views of the IC device 100 along lines 4—4, 5—5, 6—6, 7—7 and 8—8, respectively, which are shown in FIG. 2. As illustrated in FIG. 2, the output bipolar transistor 104 includes an n-type collector region 202, a p-type base region 204, n-type emitter regions 206 and oxide-filled deep trench isolations 208. Although the output transistor 104 is shown to include five n-type emitter regions 206, the output transistor may include fewer or more n-type emitter regions. The collector region 202 is first formed in the substrate 106. The base region 204 is then formed in the collector region 202, and similarly, the emitter regions 206 are formed in the base region. The emitter regions 206 are formed in the base region 204 such that the emitter regions define elongated areas on the surface of the substrate 106. As a result, the base region 204 includes corresponding elongated portions on the surface of the substrate 106, which are defined by the emitter regions 206 and the collector region 204. The collector, base and emitter regions 202, 204 and 206 are electrically connected to interconnects 410, 420 and 430, respectively, which are illustrated in FIGS. 4, 5 and 6. Each of the interconnects 410, 420 and 430 is formed of metallization on one or more metal levels. As an example, the interconnect 410 for the collector region 202 is formed of metallization on metal 2 level, as illustrated in FIG. 5. The interconnect 420 for the base region 204 is formed of metallization on metal 3 level, as illustrated in FIG. 6. Lastly, the interconnect 430 for the emitter regions 206 are formed of metallization on metal 1 level and metal 2 level, as illustrated in FIGS. 4 and 5. As shown in FIGS. 5 and 6, the interconnects 410, 420 and 430 traverse through the heat-absorbing structure 108 to reach the collector, base and emitter regions 202, 204 and 206 of the output bipolar transistor 104.

Figure 7:
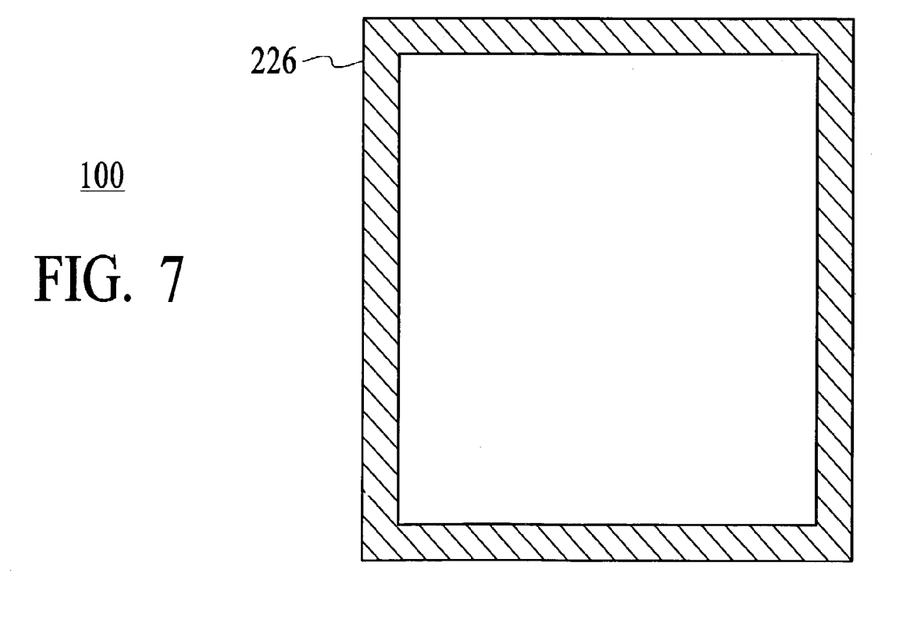
Figure 8:
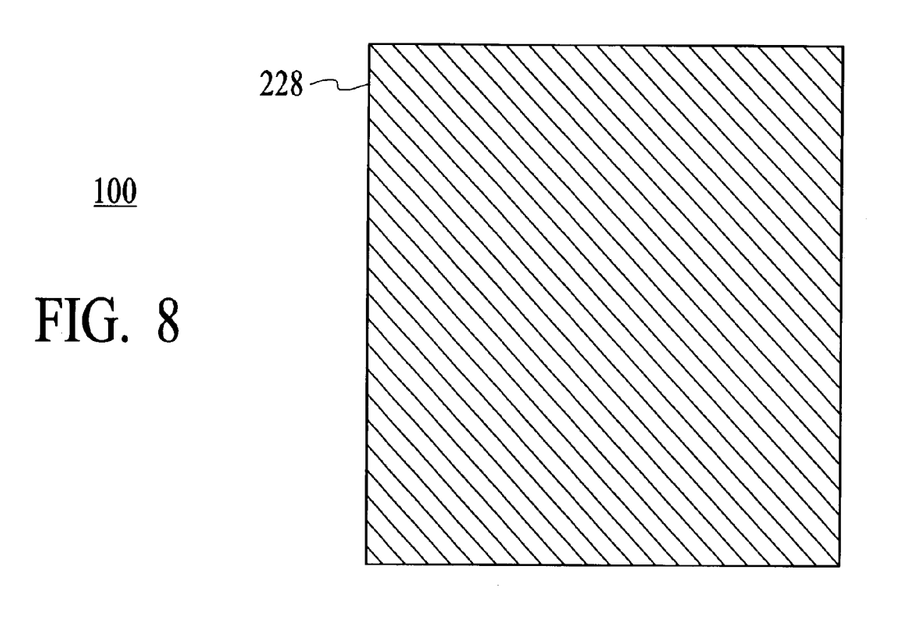

As shown in FIGS. 2 and 3, the heat-absorbing structure 108 is composed of patterned metal layers 220, 222, 224, 226 and 228 on five metal levels and plugs 230 that interconnect the metal layers. The metal layers 220, 222, 224, 226 and 228 can be made of the same metallic material as the interconnects 410, 420 and 430. Alternatively, the metal layers 220, 222, 224, 226 and 228 can be made of different metallic materials as the interconnects 410, 420 and 430. The metal layers 220, 222, 224 and 226 on metal 1–4 levels and the plugs 230 form the sides of the heat-absorbing structure 108. Thus, viewed from above, as illustrated in FIGS. 4–7, each of the metal layers 220, 222, 224 and 226 outlines a rectangle with the output transistor 104 contained in the rectangle. However, there are breaks along one or more metal layers 220, 222, 224 and 226 to allow the interconnects 410, 420 and 430 to traverse through the sides of the heat-absorbing structure 108, as illustrated in FIGS. 3, 5 and 6. FIGS. 3 and 5 show a break in the metal layer 222 to accommodate the interconnect 410. FIG. 5 also shows a second break in the metal layer 222 to accommodate the interconnect 430. FIG. 6 shows a break in the metal layer 224 to accommodate the interconnect 432. The metal layer 228 on metal 5 level forms the upper surface of the heat-absorbing structure 108, which is shown in FIG. 8. The metal layers 220, 222, 224, 226 and 228 may be electrically connected to ground or supply voltage to reduce the parasitic capacitance caused by the interconnects 410, 420 and 430 and the adjacent metal layers 220, 222, 224 and 226.

The metal layers 220, 222, 224, 226 and 228 of the heat-absorbing structure 108 can be configured to have any thickness. As an example, the thickness of the metal layers 220, 222, 224 and 226 may each be approximately 0.5 μm, and the thickness of the metal layer 228 may be approximately 2.5 μm. The metal layers 220, 222, 224, 226 and 228 can also be made of any metallic material, such as titanium, gold, aluminum or copper. As an example, the metal layer 220 on metal 1 level may be made of titanium, while the metal layers 222, 224, 226 and 228 on metal 2–5 levels are made of aluminum. Although not illustrated, the heat-absorbing structure 108 may include a barrier layer formed on the metal layer 228 to protect the metal layer 228. As an example, the barrier layer may be made of gold. Furthermore, the heat-absorbing structure 108 may include transitional layers formed between the plugs 230 and the metal layers 220, 222, 224, 226 and 228. As an example, the transitional layers may be made of titanium nitride.

As illustrated in FIG. 3, the heat-absorbing structure 108 may be attached to a heat sink 310 to dissipate the heat absorbed by the heat-absorbing structure. The heat sink 310 is not shown in FIGS. 1 and 2. As an example, the IC device 100 may be flip chip attached to the heat sink 310 using a solder bump applied to the metal layer 228 of the heat-absorbing structure 108.

The heat-insulating trenches 112 of the IC device 100 are fabricated in the substrate 106 such that the heat-insulating trenches are positioned between the output transistor 104 and the laser diode 102. As illustrated in FIG. 1, the heat-insulating trenches 112 are substantially linear and are positioned next to the heat-absorbing structure 108. The length of the heat-insulating trenches 112 may be shorter or longer than the adjacent side of the heat-absorbing structure 108. The depth and width of the heat-insulating trenches 112 may be varied such that the heat transfer between the output transistor 104 and the laser diode 102 is minimized. As an example, the depth of the heat-insulating trenches 112 may be approximately 100 μm, and the width of the heat-insulating trenches may be approximately 10 μm. As stated above, the heat-insulating trenches 112 are filled with oxide or other thermally insulating material. The heat-insulating trenches 112 may be formed using the same fabrication process as the trench isolations 208 of the output transistor 104. Although the heat-insulating trenches 112 are shown in FIG. 2 to be different in size compared to the trench isolations 208 of the output transistor 104, the heat-insulating trenches and the trench isolations may be fabricated to be identical in size.

In other embodiments, the heat-absorbing structure 108 of the IC device 100 may be designed to encase more than one electrical component. As an example, the heat-absorbing structure 108 may be enlarged to encase two bipolar transistors or complementary metal-oxide semiconductor (CMOS) transistors. Furthermore, in other embodiments, the IC structure 100 may include additional heat-absorbing structures with or without additional heat-insulating trenches.

Figure 9:
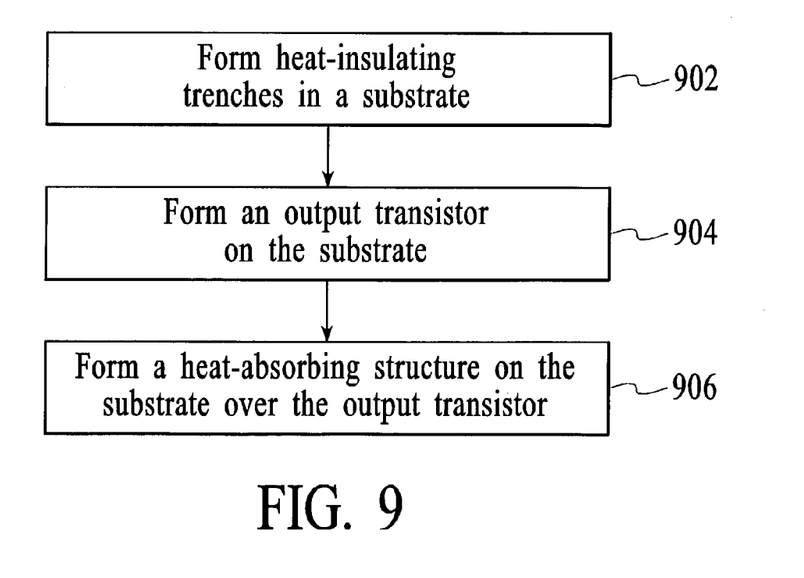
FIG. 9 is a flow diagram of a method of fabricating an IC device in accordance with one embodiment of the invention.
Figure 10:
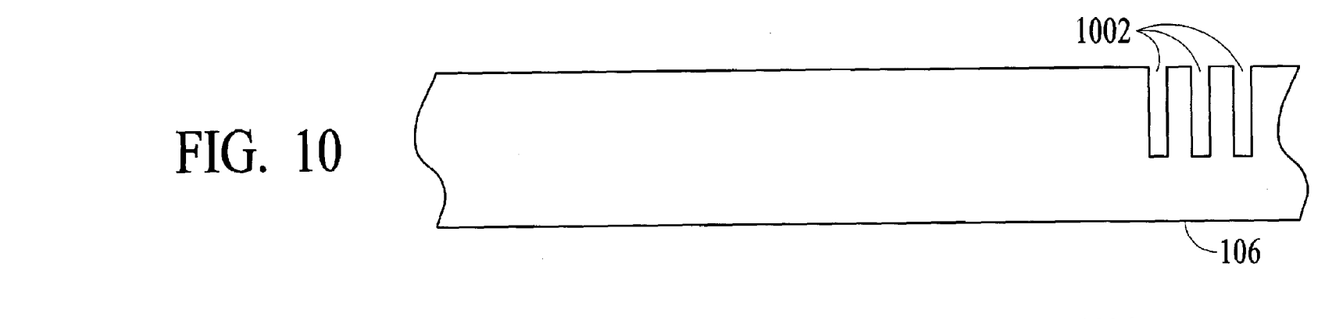
FIGS. 10–23 illustrate various stages during the fabrication of an IC device.
Figure 11:
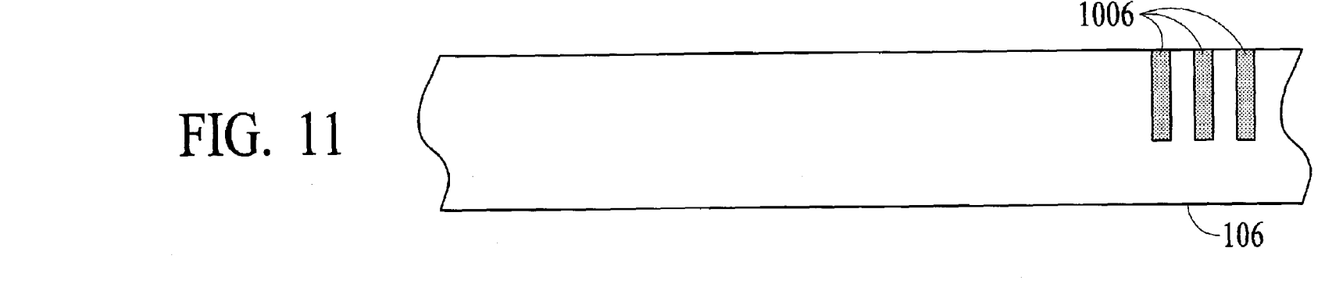
Figure 12:
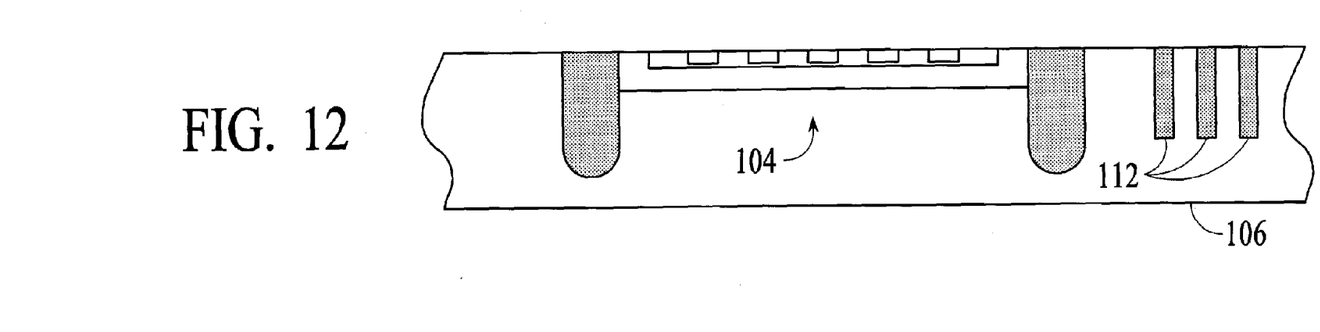

A method for fabricating the IC device 100 in accordance with one embodiment is now described with reference to a flow diagram of FIG. 9 and illustrations of FIGS. 10–23. FIGS. 10–23 are cross-sectional views that correspond to the line 3—3, as shown in FIG. 1, which dissects one sidewall of the heat-absorbing structure 108. At block 902, the heat-insulating trenches 112 are formed in the substrate 106. The heat-insulating trenches 112 can be formed by creating trenches 1002 in the substrate 106, as shown in FIG. 10. As an example, the trenches 1002 can be created by etching the substrate 106 using a photoresist mask. Next, the trenches 1002 for the heat-insulating trenches 112 are filled with a thermally insulating material 1006, and then planarized, as illustrated in FIG. 11. As an example, the trenches 1002 can be filled with oxide using chemical vapor deposition (CVD). At block 904, the output transistor 104 is formed on the substrate 106, as shown in FIG. 12. The processing steps for forming a bipolar transistor on a substrate is well known, and thus, the processing steps for forming the output transistor 104 on the substrate 106 are not described herein.

Figure 13:
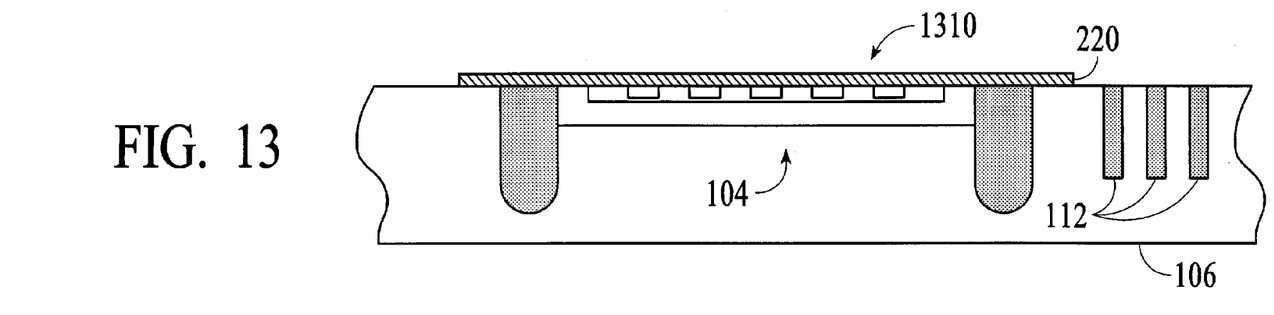
Figure 14:
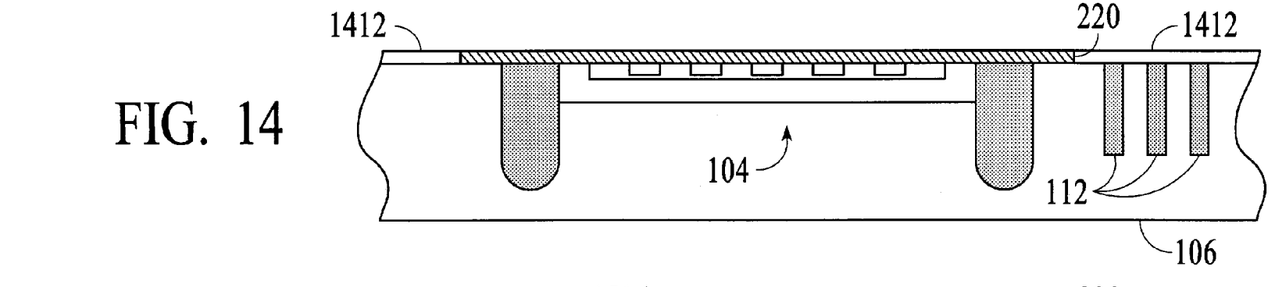
Figure 15:
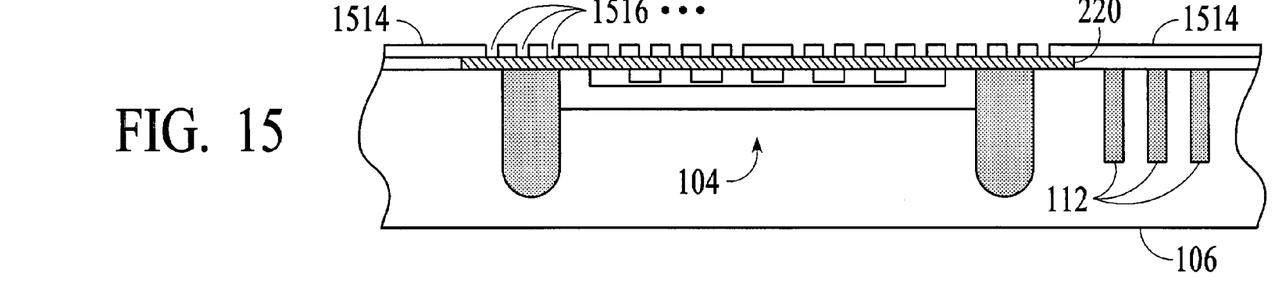
Figure 16:
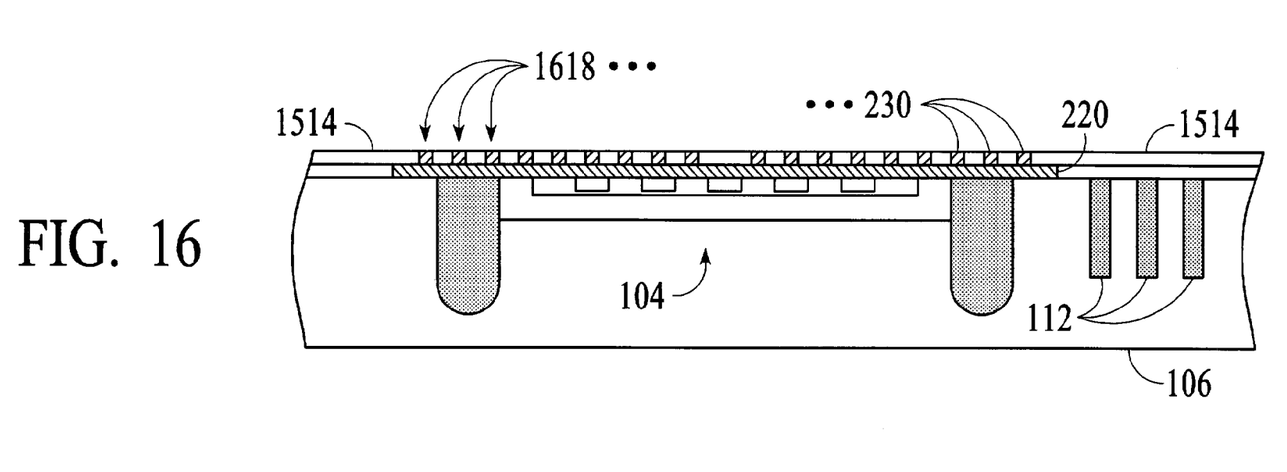
Figure 17:
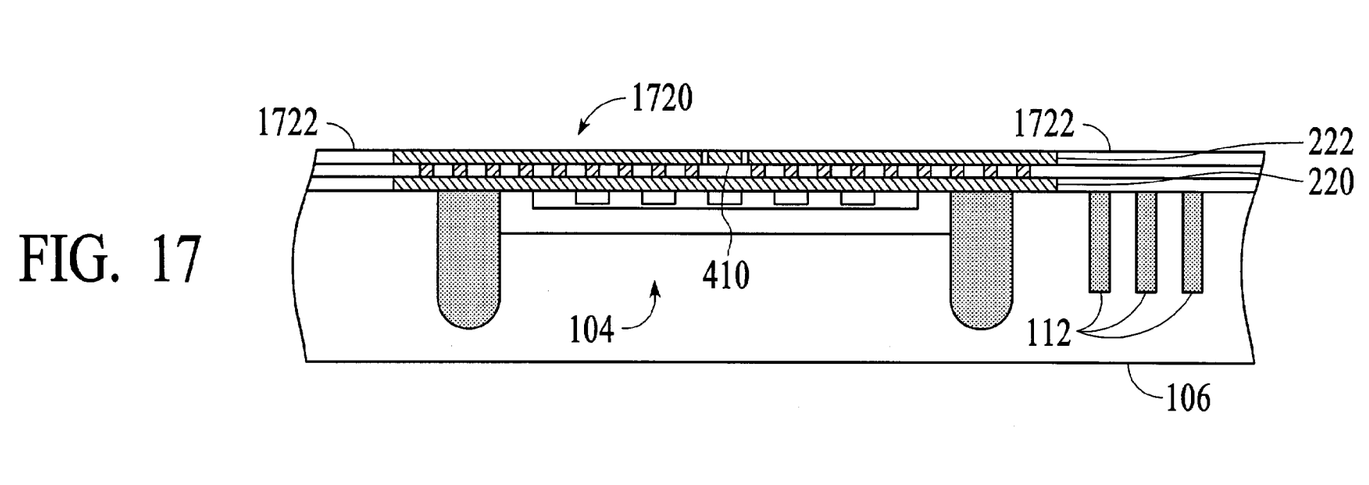

Next, at block 906, the heat-absorbing structure 108 is formed on the substrate 106 over the output transistor 104. The heat-absorbing structure 108 is formed by sequentially depositing appropriate metallic materials to construct the metal layers 220, 222, 224, 226 and 228 and the plugs 230. The metal layer 220 on metal 1 level is constructed by depositing a layer of metallic material 1310, such as titanium, and then patterning the deposited layer into the desired configuration, which is shown in FIG. 4. The resulting metal layer 220 is illustrated in FIG. 13. In addition, a part of the interconnect 430 can be similarly constructed at the same metal level. Next, a dielectric material 1412 is deposited and then planarized to form a dielectric layer at the same level as the metal layer 220, as illustrated in FIG. 14. After the metal layer 220 is constructed, a dielectric layer 1514 is formed over the metal layer 220 and vias 1516 are created through the dielectric layer 1514, as shown in FIG. 15. The vias 1516 are then filled with a metallic material 1618, such as tungsten, and planarized to construct the plugs 230, which will connect the metal layers 220 and 222, as shown in FIG. 16. The metal layer 222 on metal 2 level is then constructed in a similar manner as the metal layer 220 on metal 1 level, as shown in FIG. 17. The metal layer 222 is constructed by depositing a layer of metallic material 1720, such as aluminum, and then patterning the deposited layer into the desired configuration, which is shown in FIG. 5. In addition, the interconnect 410 and a part of the interconnect 430 can be similarly constructed at the same metal level. A layer of dielectric material 1722 is then formed on the same metal level as the metal layer 222 in a similar manner as the layer of dielectric material 1412.

Figure 18:
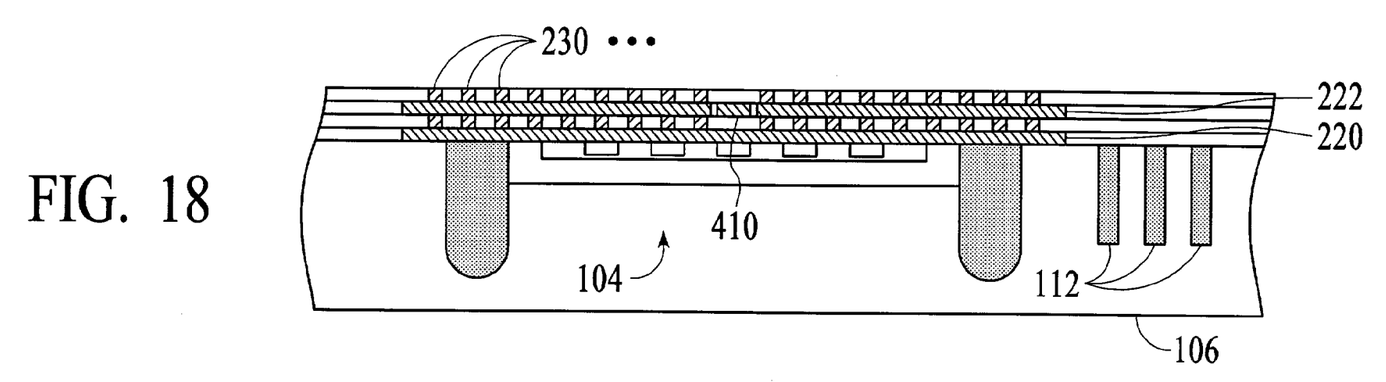
Figure 19:
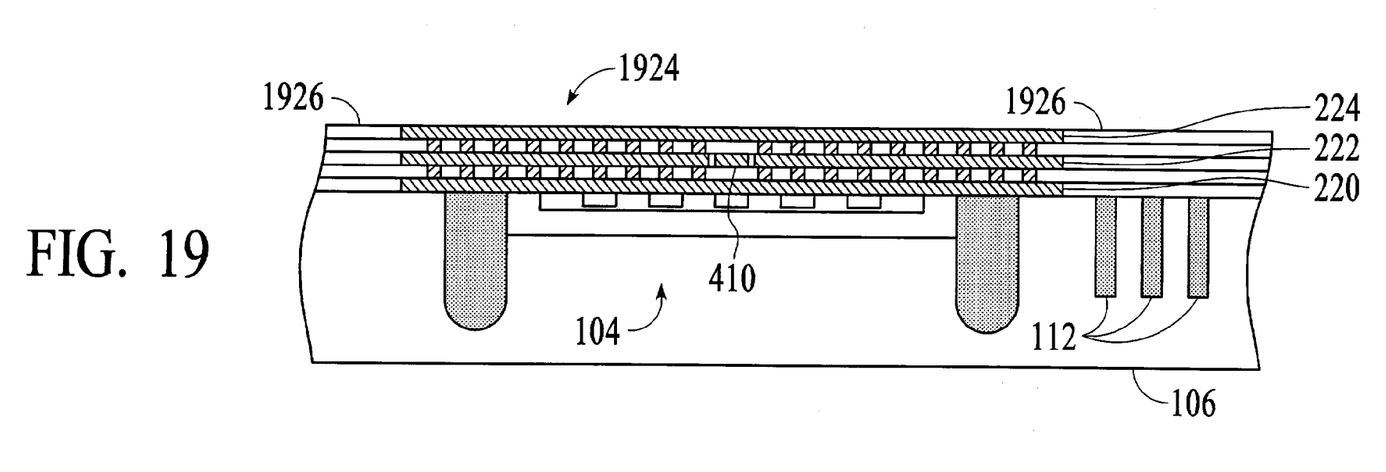

After the metal layer 222 is constructed, the plugs 230 that will connect the metal layers 222 and 224 are constructed in the same manner as the plugs 230 between the metal layers 220 and 222, as shown in FIG. 18. Next, the metal layer 224 on metal 3 level is then constructed in a similar manner as the other metal layers 220 and 222. The metal layer 224 is constructed by depositing a layer of metallic material 1924, such as aluminum, and then patterning the deposited layer into the desired configuration, which is shown in FIG. 6. In addition, the interconnect 420 can be similarly constructed at the same metal level. A layer of dielectric material 1926 is then formed on the same metal level as the metal layer 222 in a similar manner as the layer of dielectric material 1412.

Figure 20:
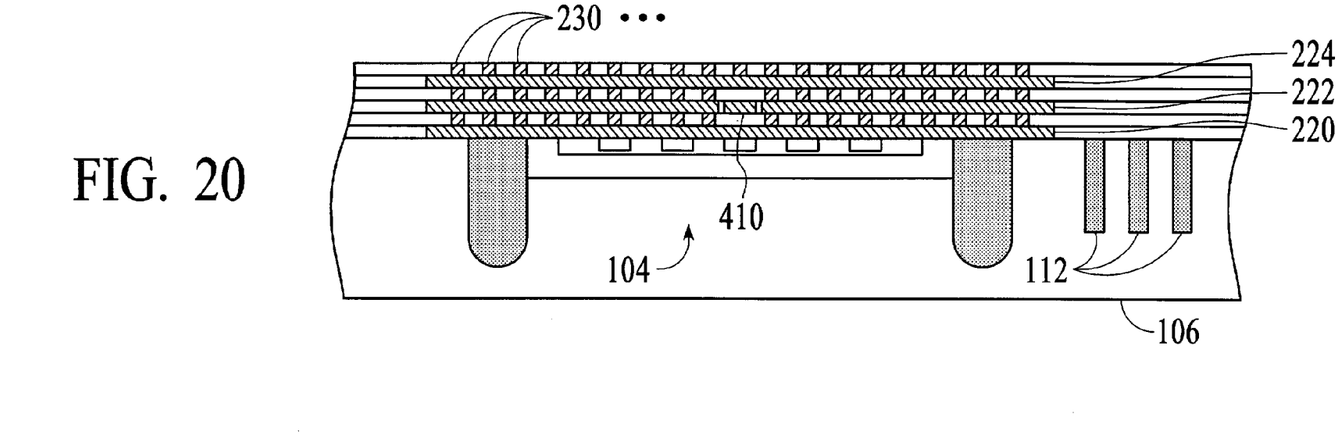
Figure 21:
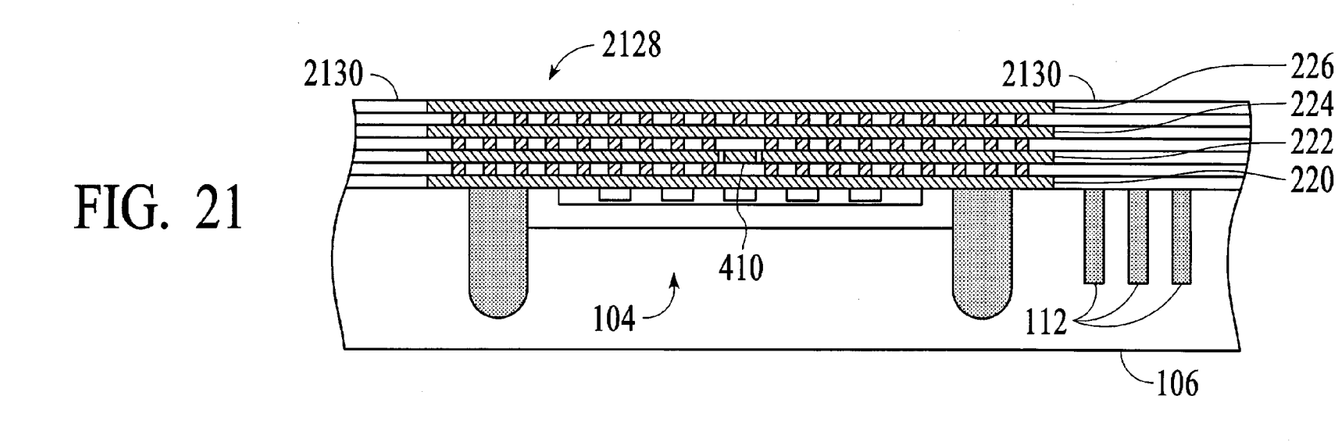

After the metal layer 224 is constructed, the plugs 230 that will connect the metal layers 224 and 226 are constructed in the same manner as the plugs 230 between the metal layers 220, 222 and 224, as shown in FIG. 20. Next, the metal layer 226 on metal 4 level is then constructed in a similar manner as the other metal layers 220, 222 and 224. The metal layer 226 is constructed by depositing a layer of metallic material 2128, such as aluminum, and then patterning the deposited layer into the desired configuration, which is shown in FIG. 7. A layer of dielectric material 2130 is then formed on the same metal level as the metal layer 222 in a similar manner as the layer of dielectric material 1412.

Figure 22:
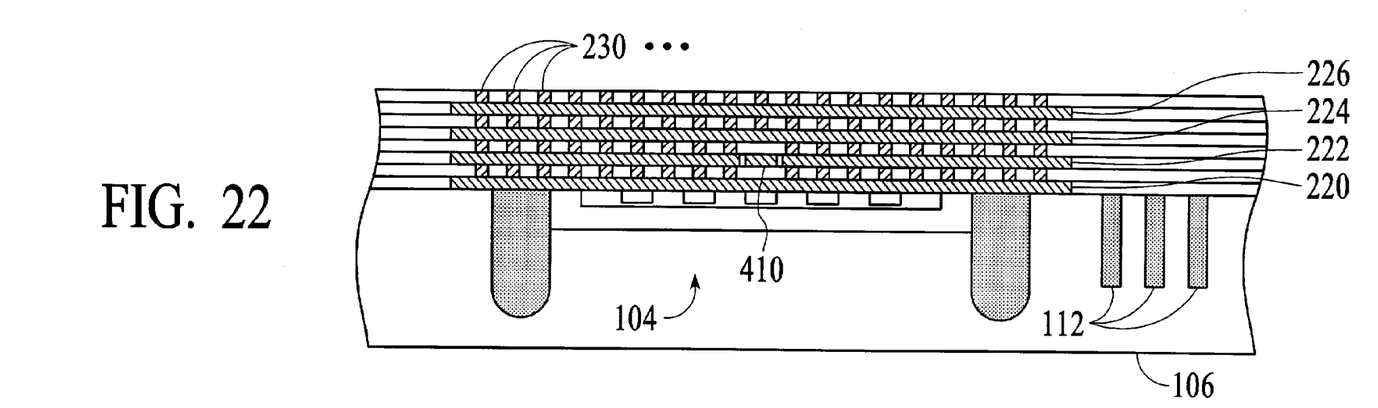
Figure 23:
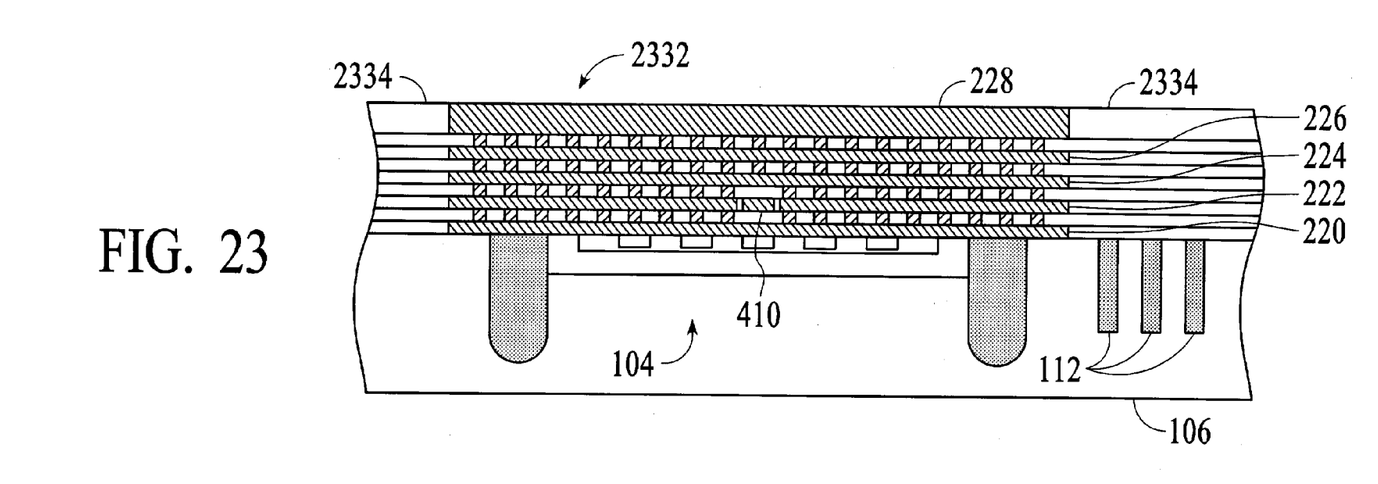

After the metal layer 226 is constructed, the plugs 230 that will connect the metal layers 226 and 228 are constructed in the same manner as the plugs 230 between the metal layers 220, 222 and 224, as shown in FIG. 22. Next, the metal layer 228 on metal 4 level is then constructed in a similar manner as the other metal layers 220, 222, 224 and 226. The metal layer 228 is constructed by depositing a layer of metallic material 2332, such as aluminum, and then patterning the deposited layer into the desired configuration, which is shown in FIG. 8. A layer of dielectric material 2334 is then formed on the same metal level as the metal layer 228 in a similar manner as the layer of dielectric material 1412.

In order to provide a more lucid description of the fabrication method, some of the processing steps have been omitted. As an example, the processing steps for forming the transitional and barrier layers of the heat-absorbing structure 108 have been omitted. In addition, the processing steps for forming plugs to electrically contact the interconnects 410, 420 and 430 to the collector, base and emitter regions 202, 204 and 206 of the output transistor 104 have been omitted. The omitted processing steps are processing steps that are well known in the field of semiconductor processing, and thus, are not repeated herein.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An integrated circuit device comprising:
    a semiconductor substrate;
    an electrical component formed on said semiconductor substrate, said electrical component being configured to generate heat during operation; and
    a thermally conductive structure formed on said semiconductor substrate over said electrical component, said thermally conductive structure being designed to absorb some of said heat generated by said electrical component to reduce heat transfer from the electrical component, wherein said electrical component is an output transistor of the circuit fabricated on the substrate.

2. The integrated circuit device of claim 1 wherein said thermally conductive structure is configured to substantially encase said electrical component.

3. The integrated circuit device of claim 2 wherein said thermally conductive structure is made of a metallic material.

4. The integrated circuit device of claim 3 wherein said thermally conductive structure includes multi-level patterned metal layers that are interconnected by plugs.

5. The integrated circuit device of claim 4 wherein at least one of said multi-level patterned metal layers includes a break for an interconnect to traverse through said thermally conductive structure to connect with said electrical component.

6. The integrated circuit device of claim 2 wherein said thermally conductive structure is shaped in a box-like configuration.

7. The integrated circuit device of claim 1 further comprising trenches formed in said semiconductor substrate next to said thermally conductive structure, said trenches being filled with a thermally insulating material.

8. The integrated circuit device of claim 7 wherein said thermally insulating material includes oxide.

9. An integrated circuit device for driving an external device comprising:
    a silicon substrate;
    an output transistor formed on said silicon substrate, said output transistor being designed to provide driving signals to said external device, said output transistor being configured to generate heat during operation; and
    a thermally conductive structure formed on said silicon substrate over said output transistor, said thermally conductive structure being designed to absorb some of said heat generated by said output transistor to reduce heat transfer from said output transistor.

10. The integrated circuit device of claim 9 wherein said thermally conductive structure is configured to substantially encase said output transistor.

11. The integrated circuit device of claim 10 wherein said thermally conductive structure is made of a metallic material.

12. The integrated circuit device of claim 11 wherein said thermally conductive structure includes multi-level patterned metal layers that are interconnected by plugs.

13. The integrated circuit device of claim 12 wherein at least one of said multi-level patterned metal layers includes a break for an interconnect to traverse through said thermally conductive structure to connect with said output transistor.

14. The integrated circuit device of claim 9 further comprising trenches formed in said silicon substrate next to said thermally conductive structure, said trenches being filled with a thermally insulating material.

15. The integrated circuit device of claim 14 wherein said thermally insulating material includes oxide.

16. A method for fabricating an integrated circuit device comprising:
    providing a semiconductor substrate;
    forming an electrical component on said semiconductor substrate; and
    forming a thermally conductive structure on said semiconductor substrate over said electrical component, wherein said forming of said electrical component includes forming an output transistor of the circuit on said substrate said thermally conductive structure allowing heat generated by said electrical component to be absorbed to reduce heat transfer from said electrical component.

17. The method of claim 16 wherein said forming of said thermally conductive structure includes substantially encasing said electrical component with said thermally conductive structure.

18. The method of claim 17 wherein said forming of said thermally conductive structure includes constructing multi-level patterned metal layers that are interconnected by plugs.

19. The method of claim 18 wherein said constructing of said multi-level patterned metal layer includes creating a break in one of said multi-level pattered metal layer, said break being used for an interconnect to traverse through said thermally conductive structure to connect with said electrical component.

20. The method of claim 16 further comprising forming trenches in said semiconductor substrate next to said thermally conductive structure, including filling said trenches with a thermally insulating material.

21. The method of claim 20 wherein said filling of said trenches includes filling said trenches with oxide.

* * * * *